Figure 1:
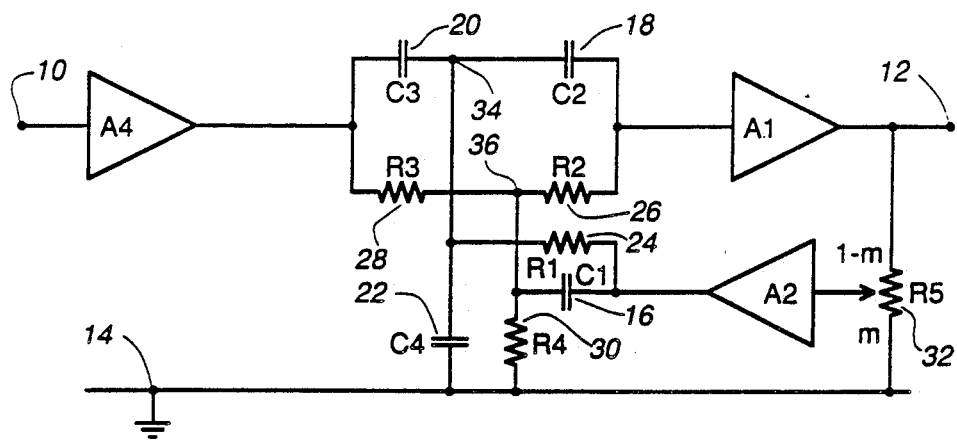

United States Patent [19]

Popescu

[11] Patent Number: 4,994,693
[45] Date of Patent: Feb. 19, 1991

[54] SECOND ORDER ACTIVE FILTERS

[75] Inventor: Petre Popescu, Kirkland, Canada

[73] Assignee: Northern Telecom Limited, Montreal, Canada

[21] Appl. No.: 443,298

[22] Filed: Nov. 30, 1989

[51] Int. Cl.$^5$ .......................... H03K 5/00; H03F 1/36; H03F 3/52

[52] U.S. Cl. .................................. 307/520; 328/167; 330/107; 330/109; 333/172

[58] Field of Search ................ 307/520, 521; 328/167; 330/107, 109; 333/176, 172, 174

[56] References Cited

U.S. PATENT DOCUMENTS

| | | | |
|---|---|---|---|
| 3,609,567 | 9/1971 | Webb | 307/520 |
| 4,553,103 | 11/1985 | Rollett | 307/520 |
| 4,920,563 | 4/1990 | Lemaire | 307/520 |

*Primary Examiner*—Timothy P. Callahan
*Attorney, Agent, or Firm*—R. John Haley; Dallas F. Smith

[57] ABSTRACT

A second order active filter comprises an input terminal, an output terminal, and a common terminal, a capacitive T-network comprising three capacitors and, in parallel therewith, a resistive T-network comprising three resistors, the terminals of the T-networks being connected respectively via a first amplifier to the output terminal, via a buffer to the input terminal, and to the common terminal, a potential divider between the output and common terminals, and a second amplifier having an input coupled to a tapping point of the potential divider and an output coupled via a resistor to the central junction of the capacitive T-network and via a capacitor to the central junction of the resistive T-network. In different configurations of the filter, the component coupled to the common terminal may be omitted from one of the T-networks, or from both of the networks with another potential divider coupled between the input and common terminals and a third amplifier coupling its tapping point to one of the networks.

12 Claims, 1 Drawing Sheet

SECOND ORDER ACTIVE FILTERS

This invention relates to second order active filters.

It is well known to provide circuits with various filter characteristics for filtering signals. With increasing complexity of electronic circuits, the design requirements for filters are becoming increasingly stringent, and the filters can become increasingly complex, costly, and difficult to adjust or tune to achieve the particular desired filter transfer characteristic.

In addition, it is desirable to facilitate the manufacture of filters at low cost, by using to the largest possible extent components which have standardized values and relatively low tolerances, and by being able to follow a tuning procedure which involves only a single adjustment of each parameter, rather than repeated and recursive adjustments.

An object of this invention, therefore, is to provide a second order active filter which can have different filter characteristics and which can be tuned easily to meet particular requirements.

According to one aspect of this invention there is provided a filter comprising: an input terminal, an output terminal, and a common terminal; a first amplifier having an output coupled to the output terminal; a second amplifier having an input coupled to the output terminal; a first resistor coupled between an output of the second amplifier and a first junction point; a first capacitor coupled between an output of the second amplifier and a second junction point; a second capacitor coupled between the first junction point and an input of the first amplifier; a second resistor coupled between the second junction point and the input of the first amplifier; a third capacitor coupled between the first junction point and one of the input and common terminals; and a third resistor coupled between the second junction point and one of the input and common terminals; at least one of the third capacitor and the third resistor being coupled to the input terminal.

In different configurations, such a filter can have a high-pass notch, low-pass notch, high-pass, or low-pass transfer characteristic, and can be conveniently manufactured and tuned. A high-pass notch filter has a notch or band-stop characteristic with attenuation of lower frequencies below the notch frequency, and conversely a low-pass notch filter has a notch or band-stop characteristic with attenuation of higher frequencies above the notch frequency.

In one configuration of the filter, the third capacitor and the third resistor are both coupled to the input terminal. Such a filter can include a fourth capacitor coupled between the first junction point and the common terminal, and/or a fourth resistor coupled between the second junction point and the common terminal. The filter can also include an amplifier via which the third capacitor and the third resistor are coupled to the input terminal, the amplifier having an input coupled to the input terminal and an output coupled to the third capacitor and the third resistor.

In another configuration, the filter includes a potential divider coupled between the input terminal and the common terminal, the potential divider having a tapping point, and a third amplifier having an input coupled to the tapping point and an output, one of the third capacitor and the third resistor being coupled to the output of the third amplifier and the other being coupled to the input terminal. Such a filter can include an amplifier via which the potential divider is coupled to the input terminal, the amplifier having an input coupled to the input terminal and an output coupled to the potential divider.

In a modification of this filter configuration, equivalent to having a zero resistance of the potential divider between its tapping point and the common terminal, the potential divider and third amplifier can be omitted and the said one of the third capacitor and the third resistor can be coupled to the common terminal. This provides a high-pass or low-pass filter, depending on whether the third resistor or the third capacitor is coupled to the common terminal.

Each of these filter configurations desirably includes a potential divider coupled between the output terminal and the common terminal, the potential divider having a tapping point to which the input of the second amplifier is coupled.

Figure 2:
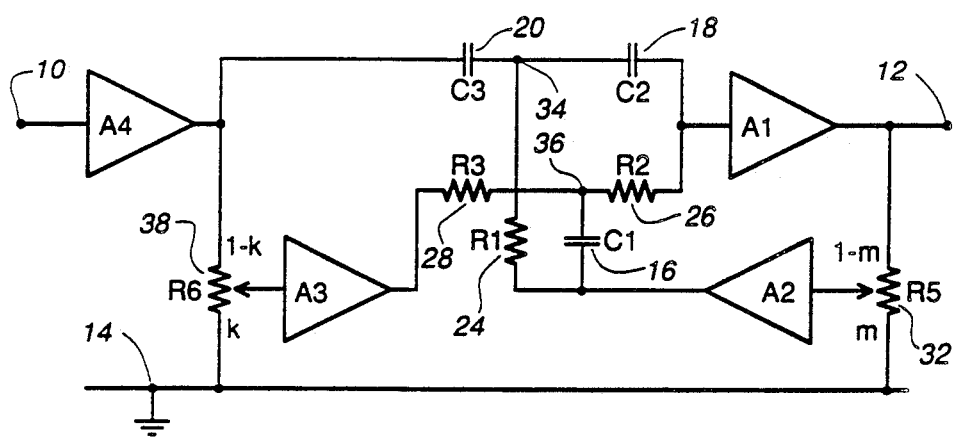
Figure 3:
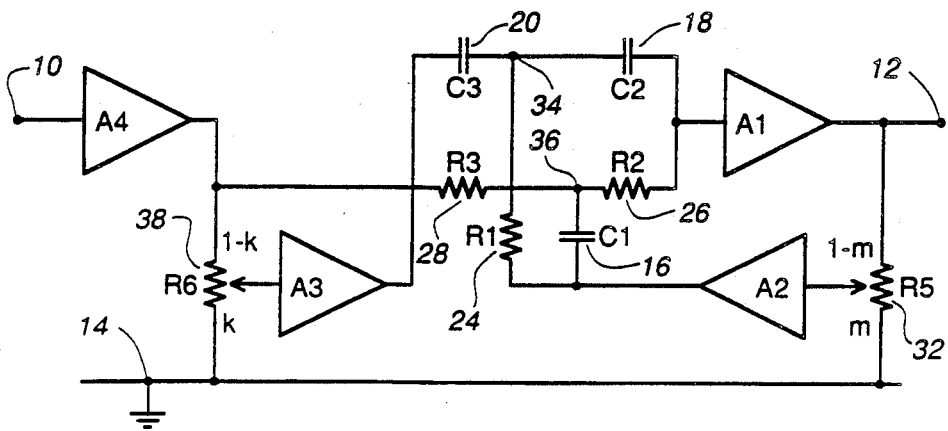

The invention will be further understood from the following description with reference to the accompanying drawings, in which the same references are used in different figures to denote similar components and in which:

FIGS. 1 to 3 schematically illustrate different forms of filter in accordance with the invention.

Referring to FIG. 1, there is illustrated therein a first form of filter in accordance with this invention. This filter is a high-pass/low-pass notch filter comprising an input terminal 10 for a signal to be filtered, an output terminal 12 for a filtered signal, a common terminal 14 which is shown as being grounded, amplifiers A1, A2, and A4, capacitors 16, 18, 20, and 22 having capacitances C1 to C4 respectively, resistors 24, 26, 28, and 30 having resistances R1 to R4 respectively, and a resistive potential divider 32 having a resistance R5. Each amplifier conveniently has a unity gain or less over the entire bandwidth of the signal to be filtered, and has a high input impedance and a low output impedance. For example, each amplifier may conveniently comprise one or more cascaded emitter follower transistor stages. The amplifier A4 is not an essential part of the filter itself but serves to isolate the remainder of the filter from preceding circuitry which is connected to the input terminal 10; accordingly this amplifier is not discussed further below.

The capacitors 18, 20, and 22 form a first T-network, and the resistors 26, 28, and 30 form a second T-network, these T-networks being coupled parallel with one another to constitute a parallel T-network coupled in series between the input terminal 10 (via the amplifier A4) and an input of the amplifier A1, with a common connection to the common terminal 14. The amplifier A1 has its output connected to the output terminal 12. The potential divider 32 is coupled between the output terminal 12 and the common terminal 14, and the amplifier A2 has an input connected to a tapping point of this potential divider 32 and an output coupled via the resistor 24 to a central junction point 34 of the capacitive T-network and via the capacitor 16 to a central junction point 36 of the resistive T-network. The potential divider 32 has a tapping ratio m, so that the resistance between the common terminal 14 and the input of the amplifier A2 is $mR5$ and the resistance between the output terminal 12 and the input of the amplifier A2 is $(1-m)R5$.

The filter of FIG. 1, which can conveniently be used for an elliptic (Cauer) or an inverted Chebyshev filter, has a transfer characteristic $T(s)$ of the form $T(s)=(s^2+z^2)/(s^2+(sp/Q)+p^2)$, and thus is controlled by the three parameters z, p, and Q. The parameter z is a zero frequency, the parameter p is a pole frequency, and the parameter Q is the quality factor of the filter. The parameters p and z are related by the equation $z^2/p^2=k_R/k_C$, where $k_R=R4/(R3+R4)$ and $k_C=C3/(C3+C4)$, so that $k_R$ and $k_C$ are both less than or equal to one. If $k_R>k_C$, the filter becomes a low-pass notch filter with $z>p$. If $k_R<k_C$, the filter becomes a high-pass notch filter with $z<p$. For the case of $k_R=1$ the resistor 30 can be omitted (i.e. $R4=\infty$), and for the case of $k_C=1$ the capacitor 22 can be omitted (i.e. $C4=0$). In any event, the component values are selected to satisfy the equation $R1=C1RR2/((C+C2)(R+R2))$, where $R=R3R4/(R3+R4)$ and $C=C3+C4$. These equations assume that the amplifiers A2 and A4 have unity gain; if this is not the case then the potential divider 32 is adjusted to change the variable m to compensate for the non-unity gain.

More particularly, the transfer characteristic of the filter of FIG. 2 can be expressed by the equation:
$T(s)=k_C(s^2+k_Rp^2/k_C)/(s^2+(sp/Q)+p^2)$, where
$p^2=(C+C2)/(CC1C2RR2)$ and
$Q=\sqrt{(CC1C2RR2/(C+C2))}/((C1R+C2(R+R2))(-1-m))$.

FIGS. 2 and 3 illustrate alternative forms of filter also with transfer characteristics controlled by the three parameters z, p, and Q, the filter of FIG. 2 being a high-pass notch filter and the filter of FIG. 3 being a low-pass notch filter. In each case, the filter is modified in relation to the filter of FIG. 1 to make the ratio z/p and the pole frequency p independent variables.

In the filter of each of FIGS. 2 and 3, the capacitor 22 and the resistor 30 are omitted, and instead of being connected directly to the output of the buffer amplifier A4 the resistor 28 in FIG. 2, or the capacitor 20 in FIG. 3, is connected to the output of a third amplifier A3, this being similar to the other amplifiers. A second resistive potential divider 38, having a tapping ratio k, is connected between the output of the buffer amplifier A4 and the common terminal 14, and an input of the amplifier A3 is connected to a tapping point of this potential divider 38.

For the filters of FIGS. 2 and 3, the above equations become as follows:
$T(s)=(s^2+kp^2)/(s^2+(sp/Q)+p^2)$ for FIG. 2, and
$T(s)=(ks^2+p^2)/(s^2+(sp/Q)+p^2)$ for FIG. 3, where in either case:
$R1=C1R2R3/((C2+C3)(R2+R3))$,
$p^2=(C2+C3)/(C1C2C3R2R3)$, and
$Q=\sqrt{(C1C2C3R2R3/(C2+C3))}/((C1R3+C2(R2+R3))(1-m))$.

If the potential divider 38 is adjusted so that $k=0$ (or equivalently if the potential divider 38 and the amplifier A3 are omitted and the resistor 28 in FIG. 2 or the capacitor 20 in FIG. 3 is connected directly to the common terminal 14), then the circuit of FIG. 2 becomes a high-pass filter, and the circuit of FIG. 3 becomes a low-pass filter.

The filters described above can be easily manufactured at relatively low cost using standard component values, and can be easily adjusted or tuned to provide a desired filter characteristic. The tuning process is conveniently accomplished with the following steps, in sequence:

(i) adjust R1 for maximum notch attenuation;
(ii) adjust $k_R$ in the filter of FIG. 1, or k in the filters of FIGS. 2 and 3, for a desired value of z/p;
(iii) adjust R2, and/or R3 for the filters of FIGS. 2 and 3, for a desired pole frequency p or zero frequency z, and adjust R1 for maximum notch attenuation; and
(iv) adjust m for a desired quality factor Q.

Although in the above filter arrangements the potential dividers 32 and 38 are described and illustrated as being constituted by variable resistors, it should of course be appreciated that they may alternatively be constituted by fixed resistors having values to provide the desired filter characteristics. In addition, although each of FIGS. 1 to 3 shows the buffer amplifier A4 as being present, as already mentioned this is not an essential part of the filter itself and may be omitted in particular circumstances. Numerous other modifications, variations, and adaptations may be made to the particular embodiments of the invention described above without departing from the scope of the invention as defined in the claims.

What is claimed is:
1. A filter comprising:
an input terminal, an output terminal, and a common terminal;
a first amplifier having an output coupled to the output terminal;
a second amplifier having an input coupled to the output terminal;
a first resistor coupled between an output of the second amplifier and a first junction point;
a first capacitor coupled between the output of the second amplifier and a second junction point;
a second capacitor coupled between the first junction point and an input of the first amplifier;
a second resistor coupled between the second junction point and the input of the first amplifier;
a third capacitor coupled between the first junction point and one of the input and common terminals; and
a third resistor coupled between the second junction point and one of the input and common terminals;
at least one of the third capacitor and the third resistor being coupled to the input terminal.

2. A filter as claimed in claim 1 wherein the third capacitor and the third resistor are both coupled to the input terminal.

3. A filter as claimed in claim 2 and including a fourth capacitor coupled between the first junction point and the common terminal.

4. A filter as claimed in claim 2 and including a fourth resistor coupled between the second junction point and the common terminal.

5. A filter as claimed in claim 3 and including a fourth resistor coupled between the second junction point and the common terminal.

6. A filter as claimed in claim 2 and including a potential divider coupled between the output terminal and the common terminal, the potential divider having a tapping point to which the input of the second amplifier is coupled.

7. A filter as claimed in claim 2 and including am amplifier via which the third capacitor and the third resistor are coupled to the input terminal, the amplifier having an input coupled to the input terminal and an output coupled to the third capacitor and the third resistor.

8. A filter as claimed in claim 1 and including a potential divider coupled between the input terminal and the common terminal, the potential divider having a tapping point, and a third amplifier having an input coupled to the tapping point and an output, wherein one of the third capacitor and the third resistor is coupled to the output of the third amplifier and the other is coupled to the input terminal.

9. A filter as claimed in claim 8 wherein the third resistor is coupled to the output of the third amplifier.

10. A filter as claimed in claim 8 wherein the third capacitor is coupled to the output of the third amplifier.

11. A filter as claimed in claim 8 and including an amplifier via which the potential divider is coupled to the input terminal, the amplifier having an input coupled to the input terminal and an output coupled to the potential divider.

12. A filter as claimed in claim 8 and including a second potential divider coupled between the output terminal and the common terminal, the second potential divider having a tapping point to which the input of the second amplifier is coupled.

* * * * *